United States Patent
Kossives et al.

(10) Patent No.: US 7,733,661 B2
(45) Date of Patent: Jun. 8, 2010

(54) CHIP CARRIER AND FABRICATION METHOD

(75) Inventors: Dean Paul Kossives, Glen Gardner, NJ (US); Byung Joon Han, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/393,034

(22) Filed: Feb. 25, 2009

(65) Prior Publication Data

US 2009/0161330 A1 Jun. 25, 2009

Related U.S. Application Data

(63) Continuation of application No. 11/877,613, filed on Oct. 23, 2007, now Pat. No. 7,525,812.

(51) Int. Cl.
*H05K 7/00* (2006.01)
(52) U.S. Cl. ........................ 361/760; 174/260
(58) Field of Classification Search ............... 361/760, 361/763, 764, 766, 767, 782, 883; 174/260, 174/262, 263
See application file for complete search history.

(56) References Cited

U.S. PATENT DOCUMENTS

| | | | |
|---|---|---|---|
| 5,421,083 A | 6/1995 | Suppelsa et al. | |
| 5,538,433 A | 7/1996 | Arisaka | |
| 5,608,262 A | 3/1997 | Degani et al. | |
| 5,613,033 A | 3/1997 | Swamy et al. | |
| 5,646,828 A | 7/1997 | Degani et al. | |
| 5,929,375 A | 7/1999 | Glovatsky et al. | |
| 6,052,287 A | 4/2000 | Palmer et al. | |
| 6,235,994 B1 | 5/2001 | Chamberlin et al. | |
| 6,259,037 B1 | 7/2001 | Feilchenfeld et al. | |
| 6,335,495 B1 | 1/2002 | Farquhar et al. | |
| 6,395,996 B1* | 5/2002 | Tsai et al. | 174/260 |
| 6,639,155 B1* | 10/2003 | Bupp et al. | 174/260 |
| 6,700,076 B2 | 3/2004 | Sun et al. | |
| 6,710,258 B2 | 3/2004 | Oggioni et al. | |
| 6,728,113 B1 | 4/2004 | Knight et al. | |
| 6,917,525 B2 | 7/2005 | Mok et al. | |
| 6,965,170 B2 | 11/2005 | Memis | |
| 7,457,132 B2* | 11/2008 | Gisin et al. | 361/782 |
| 7,515,434 B2* | 4/2009 | Wyrzykowska et al. | 361/763 |

* cited by examiner

*Primary Examiner*—Michael C Zarroli
(74) *Attorney, Agent, or Firm*—Mikio Ishimaru

(57) ABSTRACT

A substrate having a ground plane, a first side, and a second side is provided. A via that electrically connects the first side to the second side is formed. A printed wire is formed on the first side, and a printed wire is formed on the second side. A passive component is formed on the first side. The passive component is formed free of the ground plane. An active component is attached to the first side.

14 Claims, 8 Drawing Sheets

CHIP CARRIER AND FABRICATION METHOD

CROSS-REFERENCE TO RELATED APPLICATION(S)

This application is a continuation of U.S. Non Provisional patent application Ser. No. 11/877,613 filed Oct. 23, 2007, which is a continuation of U.S. Non Provisional application Ser. No. 11/277,973 filed Mar. 30, 2006, and the subject matter thereof is hereby incorporated herein by reference thereto.

TECHNICAL FIELD

The present invention relates to multi-chip modules for semiconductors, and more particularly to an electrical connection structure for radio frequency semiconductors.

BACKGROUND ART

In recent years, the need for integrated circuits operating in the microwave or millimeter wave band has increased due to the widespread use of mobile communications devices such as cellular phones. As consumers demand more functionality from their mobile communications devices, the need for more complex integrated circuits increases. As a result, highly integrated circuits with radio frequency based components have been developed having passive components, such as resistors, capacitors, inductors, and baluns.

Passive components may have their characteristics significantly altered when located directly on an integrated circuit that is operating in a radio frequency band. Consequently, passive components are positioned on a separate integrated circuit or on a separate package so as to prevent interaction between the active components and the passive components. Properly positioning the passive components also involves distancing them from active components, thus increasing the size of the device being manufactured.

In addition, passive components must be positioned away from wires connecting active components. For example, an active component mounted in a package or on a substrate has bonding wires used for electrical connection purposes. The bonding wires tend to have substantial electrical influence on any nearby passive components. In order to obtain the expected circuit performance of passive components, it is important to minimize the effect of such electrical influence.

One method for reducing the above-mentioned electrical influence is to increase, as much as possible, the number of bonding wires that extend from within the active component and connect to either lead frames or slugs, located immediately below the active component. In doing so, a number of bonding wires are arranged in parallel connection, thus reducing the total electrical influence of the bonding wires.

However, this method for minimizing electrical influence has problems. As the number of bonding wires increases, the size of the device being manufactured quickly becomes larger due to the space required between bonding wires. If bonding wires are too close, electromagnetic coupling can occur, thereby reducing component performance. Thus, a conflict occurs between keeping the component size small and the need to reduce electrical influence.

As remarkable technological progress has been achieved in the field of telecommunications in recent years, the frequency band used in communication devices has upwardly shifted from the microwave band to the millimeter-wave band. Detrimental effects, such as parasitic capacitance exerted by active components on passive components, become larger in proportion to the level of the frequency used in the communication devices. This creates additional problems with the integration of active and passive components.

As it becomes possible to fit more and more components onto a single substrate, a correspondingly larger number of interconnects may need to be fabricated on the substrate to connect the components. Conventional interconnects are typically formed on the same side of the substrate as the components and terminate at contact pads around the perimeter of the substrate. With each increase in the number of components on a single substrate, the interconnects and contact pads around the perimeter of the substrate typically become more crowded. However, in order to prevent detrimental effects, passive components cannot be crowded with active components or their interconnects.

What is needed therefore is a way to compactly integrate passive components with active components and their interconnects while preventing detrimental interaction between the passive and active components.

Solutions to these problems have been long sought but prior developments have not taught or suggested any solutions and, thus, solutions to these problems have long eluded those skilled in the art.

DISCLOSURE OF THE INVENTION

The present invention provides a substrate having a ground plane, a first side, and a second side. A via that electrically connects the first side to the second side is formed. A printed wire is formed on the first side, and a printed wire is formed on the second side. A passive component is formed on the first side. The passive component is formed free of the ground plane. An active component is attached to the first side.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
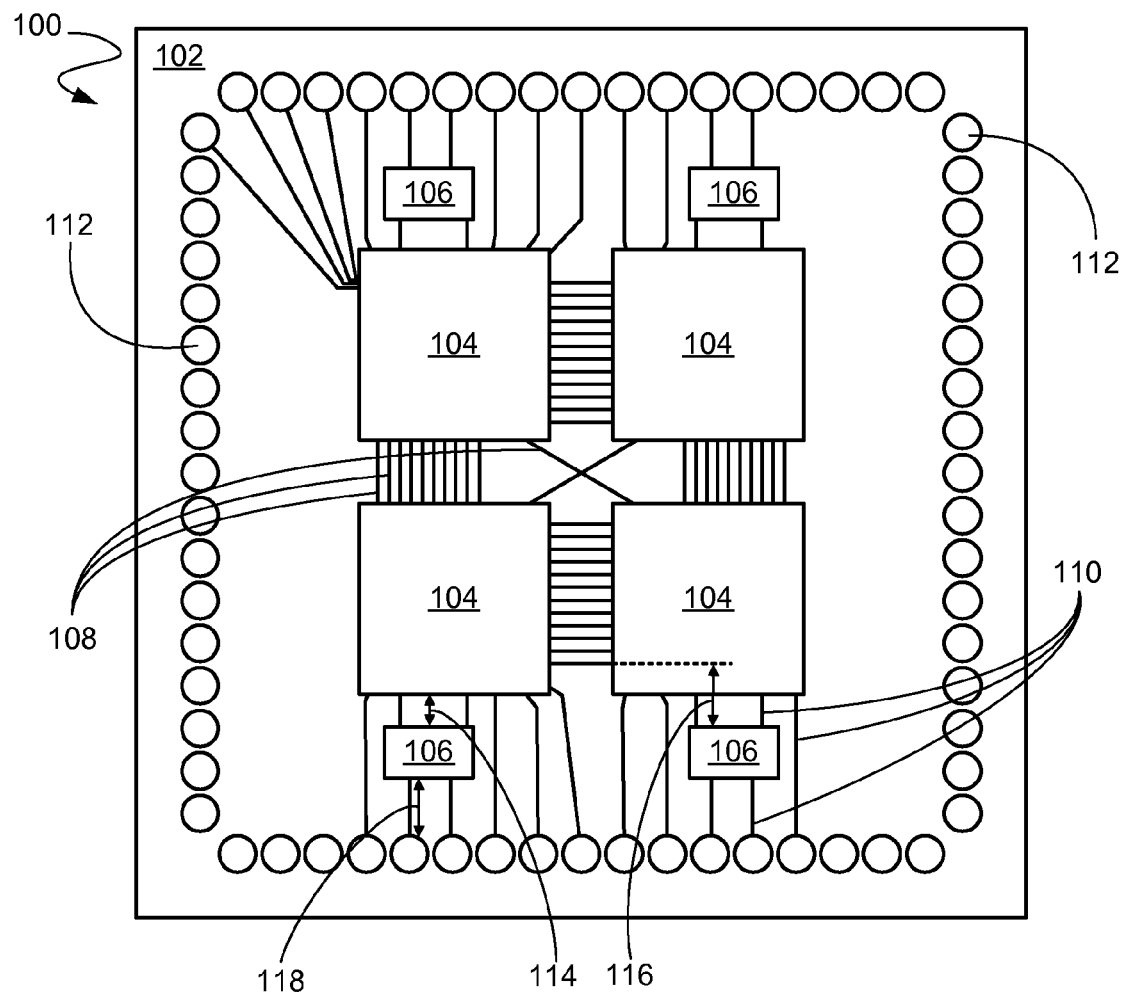
FIG. 1 (PRIOR ART) is a plan view of a single sided chip carrier.

In the following description, numerous specific details are given to provide a thorough understanding of the invention. However, it will be apparent that the invention may be practiced without these specific details. In order to avoid obscuring the present invention, some well-known package configuration structural components and process steps are not disclosed in detail.

The drawings showing embodiments of the invention are semi-diagrammatic and not to scale and, particularly, some of the dimensions are for the clarity of presentation and are shown exaggerated in the FIGs. Also, where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the conventional plane or surface of a chip carrier, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1 (PRIOR ART), therein is shown a plan view of a single sided chip carrier 100. Mounted on the surface of a silicon substrate 102 are active components 104, such as integrated circuits, and passive components 106, such as resistors, capacitors, inductors, and baluns. Wires 108 are wire bonded to the active components 104 thus interconnecting the active components 104. Printed wires 110 connect the active components 104 to the passive components 106, the active components 104 to solder balls 112, and the passive components 106 to the solder balls 112. For clarity of illustration only a few of the wires 108, the printed wires 110, and the solder balls 112 are shown.

The passive components 106 are sensitive to electro-magnetic interference. Thus, it has been discovered that in order to maintain performance, the passive components 106 must be spaced a first distance 114 at least 500 μm from the active components 104, a second distance 116 at least 500 μm from the wires 108, and a third distance 118 at least 500 μm from the solder balls 112.

The single sided chip carrier 100 has several disadvantages. First, connections are limited to the number of solder balls 112 around the periphery of the single sided chip carrier 100. If increased connections are needed, the size of the single sided chip carrier 100 must be increased to accommodate more solder balls.

The second problem is the spacing requirements of the passive components 106. By restricting the placement of the wires 108 and the active components 104, integration of the passive components 106 forces an increase in the size of the single sided chip carrier 100.

Figure 2:
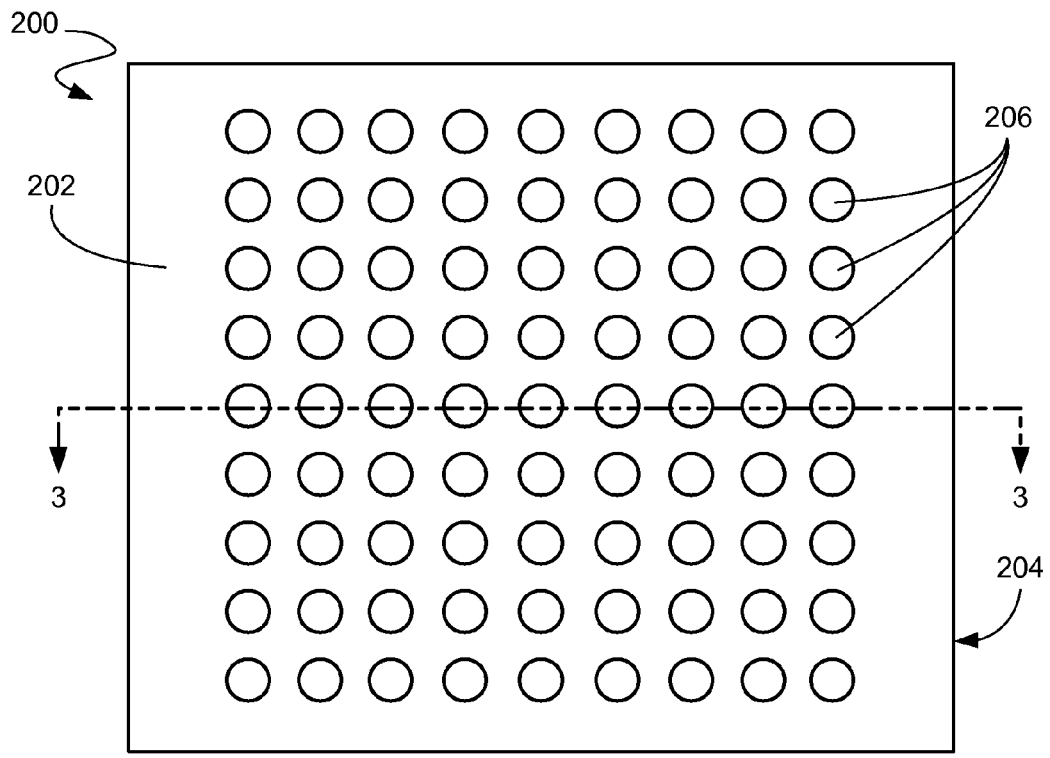
FIG. 2 (PRIOR ART) is a plan view of a first side of a double sided ball grid array chip carrier.

Referring now to FIG. 2 (PRIOR ART), therein is shown a plan view of a first side of a double sided ball grid array chip carrier 200. A first side 202 of a silicon substrate 204 is populated with solder balls 206. By placing the solder balls 206 on the first side 202, there are a greater number of connections than would be possible with an equally sized single sided chip carrier.

Figure 3:
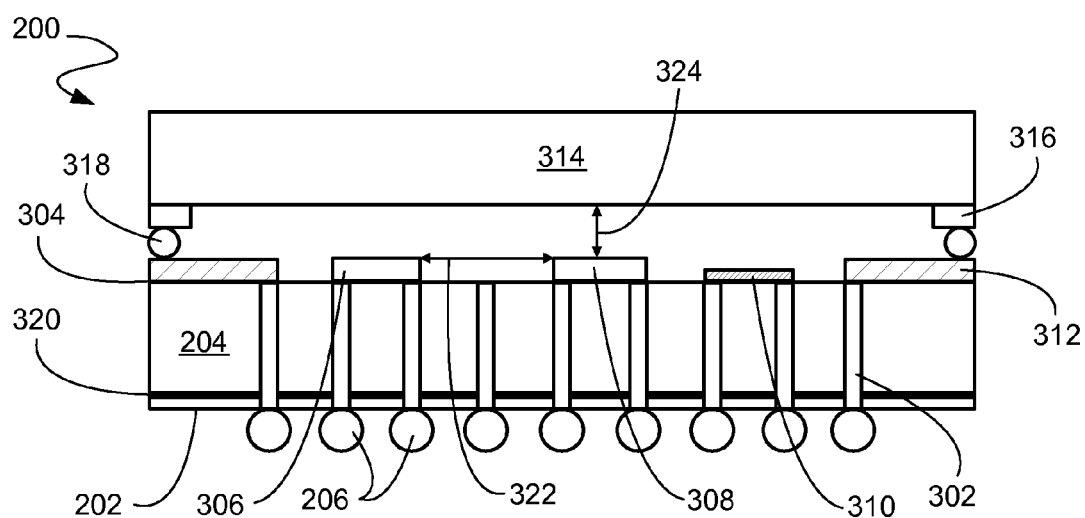
FIG. 3 (PRIOR ART) is a cross sectional view taken along line 3-3 in FIG. 2 (PRIOR ART)

Referring now to FIG. 3 (PRIOR ART), therein is shown a cross sectional view taken along line 3-3 in FIG. 2 (PRIOR ART) of the double sided ball grid array chip carrier 200. The solder balls 206 on the first side 202 are electrically connected through vias 302 to structures on a second side 304. Structures on the second side 304 may include active components 306 such as transistors, passive components 308 such as resistors and capacitors, printed wires 310, and interconnects 312. The structures are built on the silicon substrate 204 through standard photolithographic processes. In addition, a reference ground plane 320 shields the substrate 204 from some interference outside the double sided ball grid array chip carrier 200.

A component 314 is either active or passive and has a number of input/output bond pads 316. The component 314 is electrically connected through the bond pads 316 to solder bumps 318. The solder bumps 318 electrically connect to the interconnects 312 on the substrate 204.

The double sided ball grid array chip carrier 200 has several disadvantages. In order to maintain device performance, the passive components 308 must be spaced a first distance 322 at least 500 μm from the active components 306. In addition, if the component 314 is active, then the passive components 308 must be spaced a second distance 324 at least 500 μm from the component 314. This greatly increases the height as well as the width of the double sided ball grid array chip carrier 200. Thus, if the size of the double sided ball grid array chip carrier 200 needs to be reduced, then device performance will not be maintained.

Figure 4:
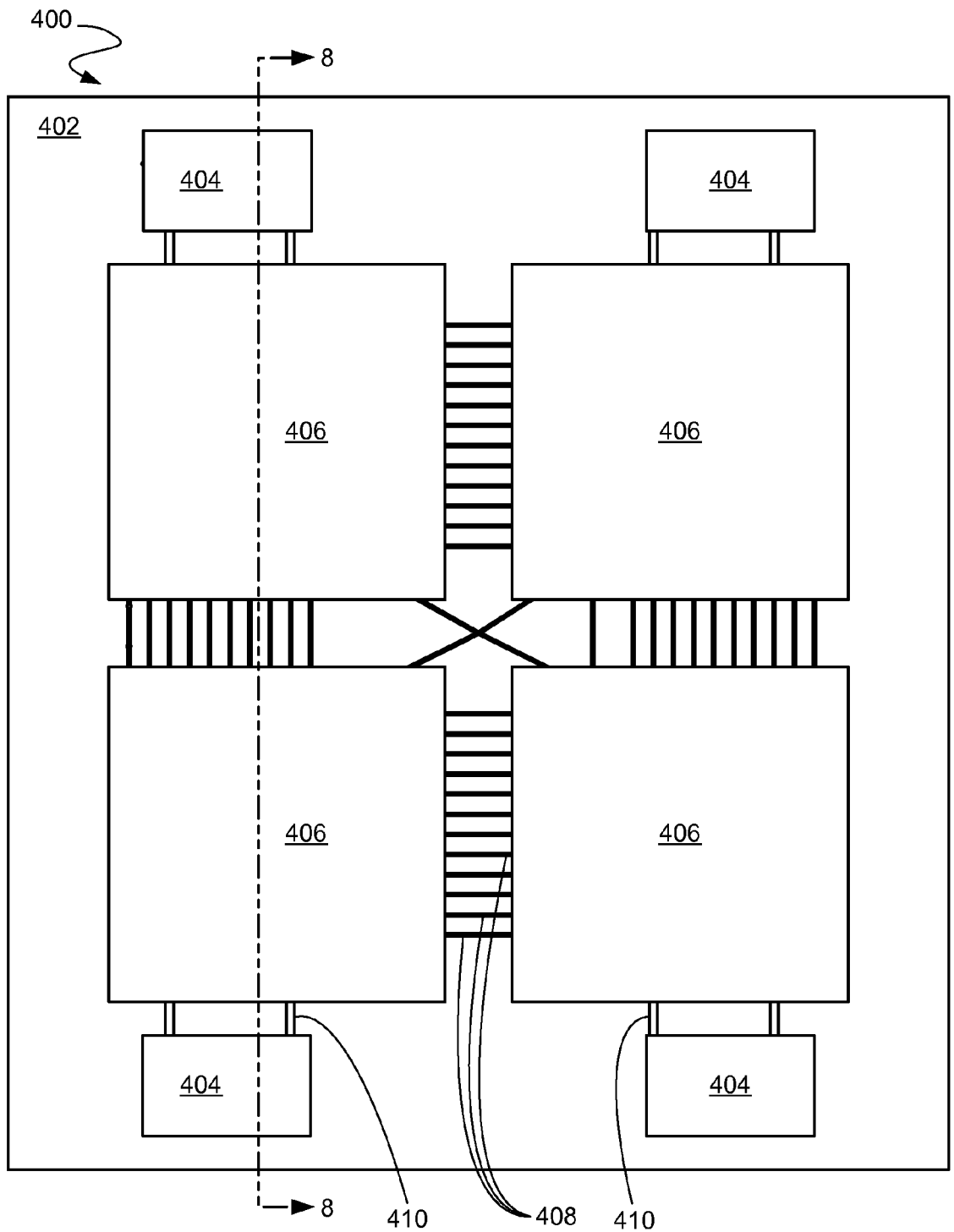
FIG. 4 is a plan view of a first side of a chip carrier in accordance with an embodiment of the present invention.

Referring now to FIG. 4, therein is shown a plan view of a first side of a chip carrier 400, in accordance with an embodiment of the present invention. Passive components 404 are formed on the surface of a substrate 402 through standard photolithographic processes. Active components 406 are formed separately and then attached to the substrate 402. Wires 408 connect the active components 406 to one another and are positioned above the substrate 402 in between their connection points. First side printed wires 410 connect the active components 406 to the passive components 404.

Figure 5:
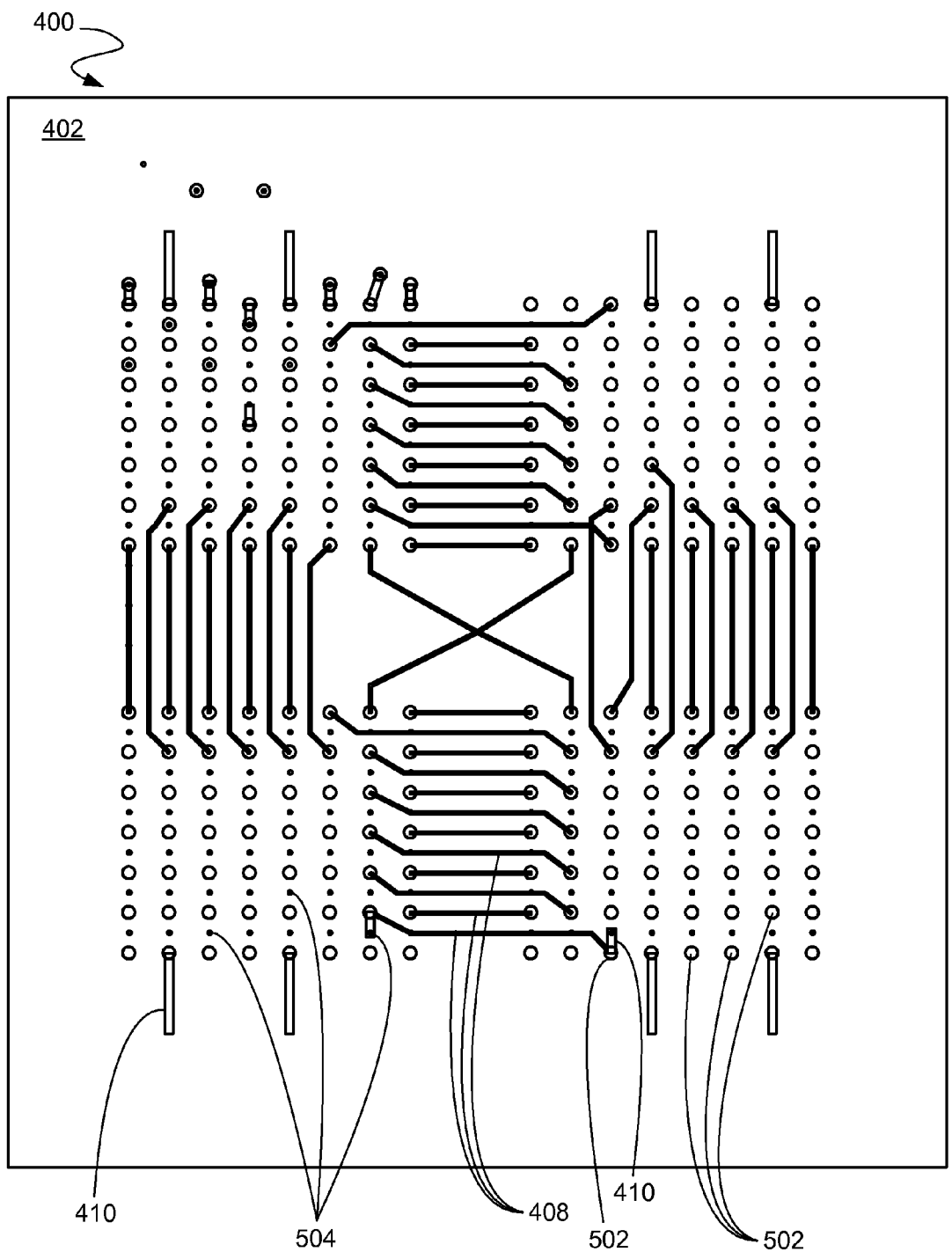
FIG. 5 is the structure of FIG. 4 without the passive and active components.

Referring now to FIG. 5, therein is shown the structure of FIG. 4 without the passive components 404 (FIG. 4) and the active components 406 (FIG. 4). Solder bumps 502 are provided for electrically connecting the active components 406 to the wires 408 and the first side printed wires 410. The first side printed wires 410 connect the solder bumps 502 and the passive components 404 to vias 504. This makes the vias 504 part of a passive network.

Figure 6:
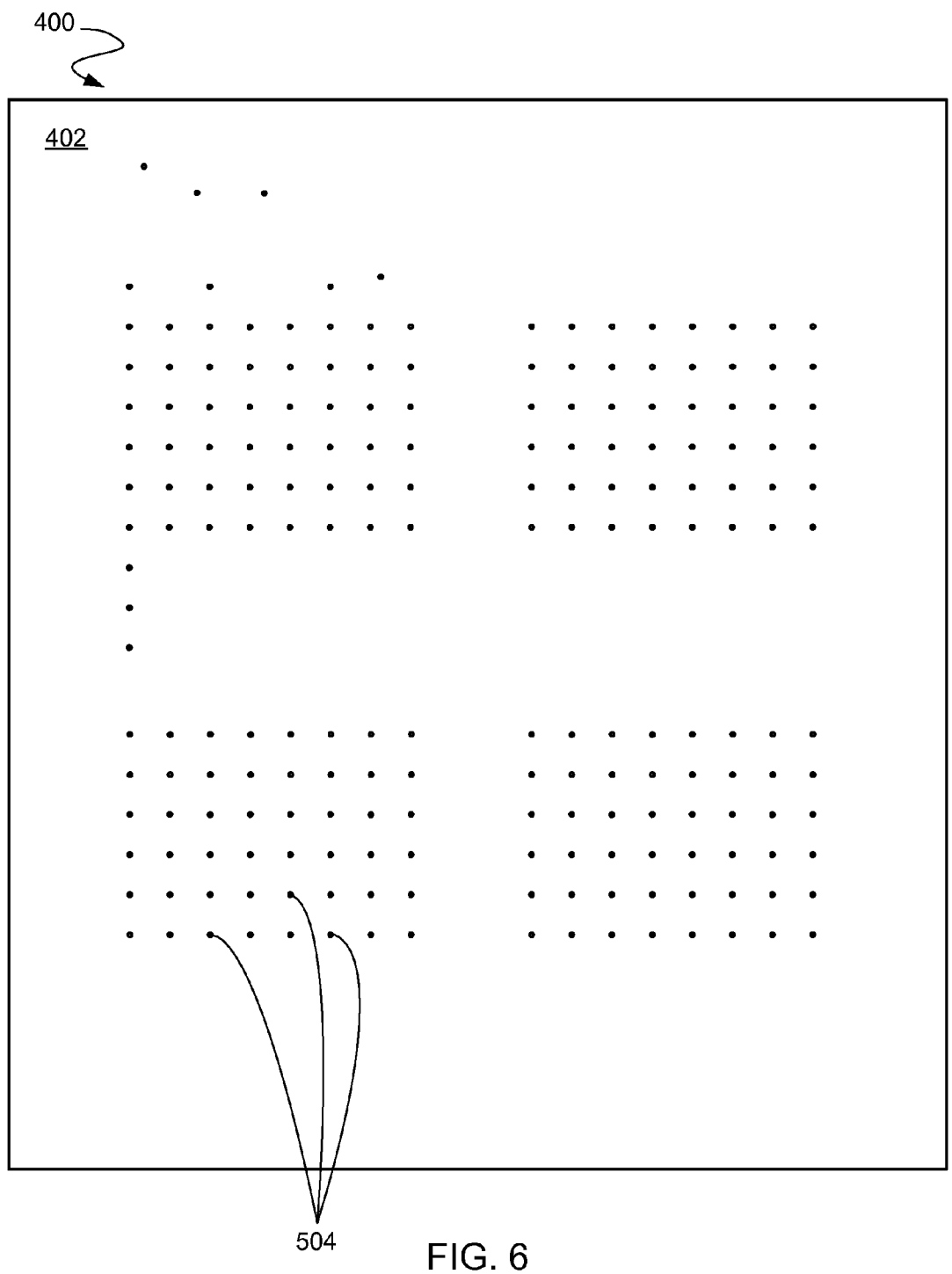
FIG. 6 is the structure of FIG. 4 without the passive components, the active components, the wires, the first side printed wires, and the solder bumps.

Referring now to FIG. 6, therein is shown the structure of FIG. 4 without the passive components 404 (FIG. 4), the active components 406 (FIG. 4), the wires 408 (FIG. 4), the first side printed wires 410 (FIG. 4), and the solder bumps 502 (FIG. 5). The vias 504 may be produced by a variety of methods such as reactive ion etching, wet etching, laser drilling, EDO drilling, or standard drilling with a ceramic bit. The vias 504 are coaxial structures, thus reducing interference in the chip carrier 400 over the wires 108 (FIG. 1 (PRIOR ART)) in the single sided chip carrier 100 (FIG. 1 (PRIOR ART)). Only the process used to make the vias 504 limits their diameter. Thus, if increased numbers of connections and the vias 504 are needed, processes creating small diameter vias 504 should be employed.

Additionally, the vias 504 can be used for enhanced thermal conduction in devices that have high power densities.

The vias 504 can also be stitched together to create a coil in linear fashion to be a component of the passive network.

Further, by placing the vias 504 very close together, mutual coupling will occur, and this can be exploited when creating many circuits requiring coupling.

Still further, the upper left passive component 404 could be a ring with via contacts at a quarter, a third, a half, etc. lengths that could be used as a coupler at high frequencies.

Figure 7:
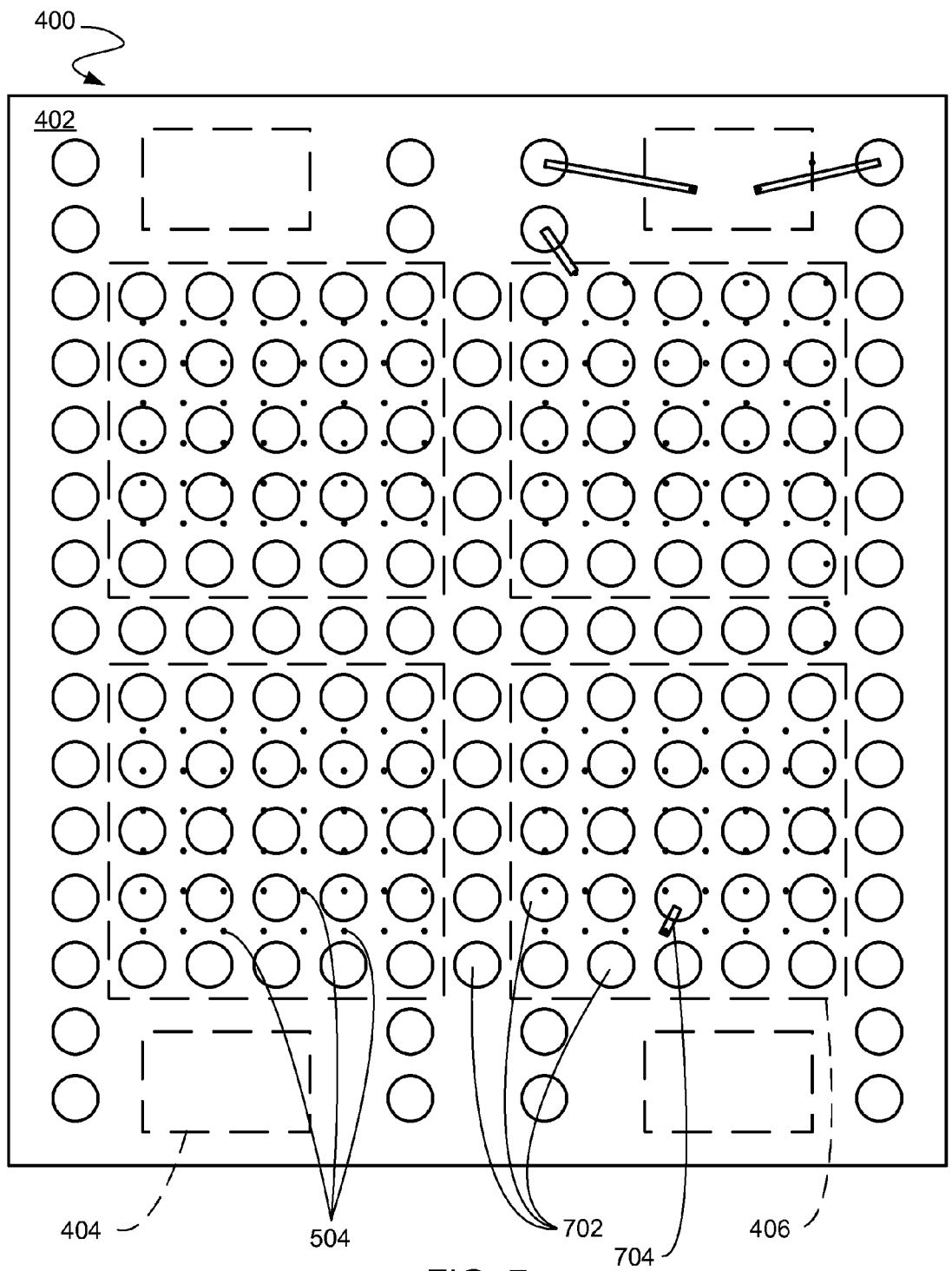
FIG. 7 is a plan view of a second side of the chip carrier.

Referring now to FIG. 7, therein is shown a plan view of a second side of the chip carrier 400. The vias 504 are electrically connected to solder balls 702 and second side printed wires 704. The solder balls 702 heavily populate the substrate 402 under the active components 406. However, in order to decrease the effects of electromagnetic interference over the solder balls 206 (FIG. 2. (PRIOR ART)) in the double sided ball grid array chip carrier 200 (FIG. 2. (PRIOR ART)), the regions of the substrate 402 under the passive components 404 are free of the solder balls 702.

Figure 8:
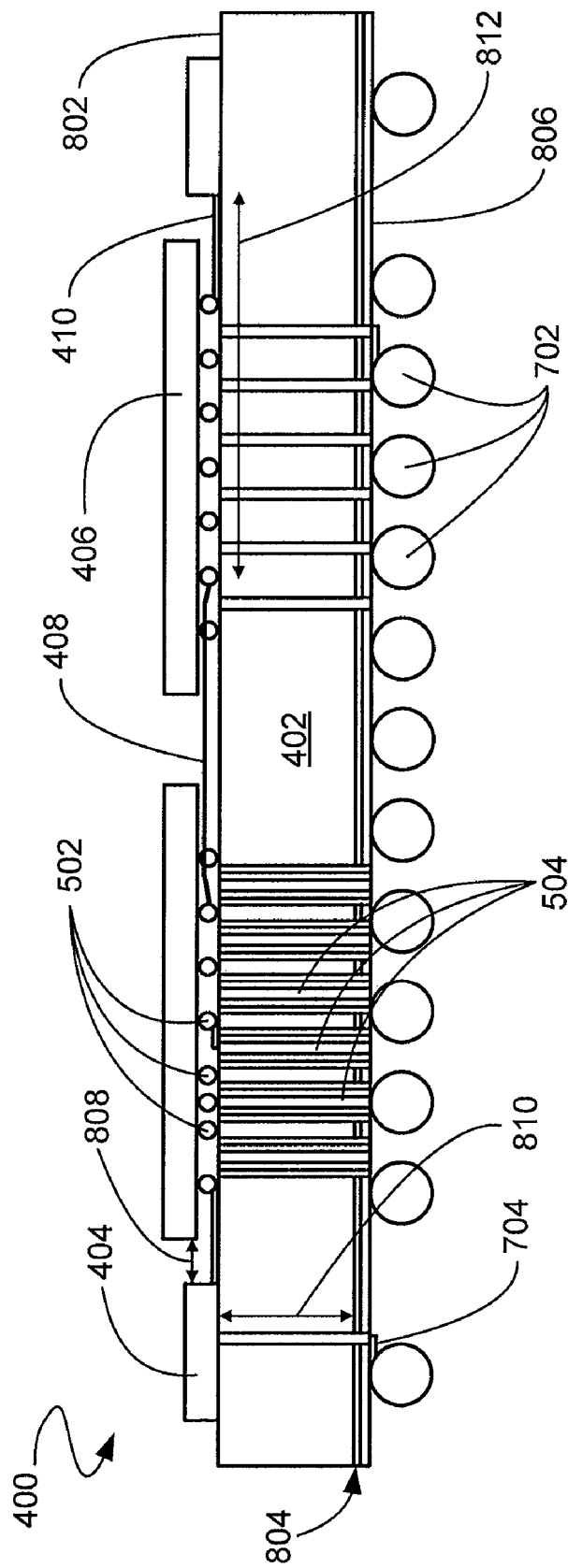
FIG. 8 is a cross-sectional view taken along line 8-8 in FIG. 4.

Referring now to FIG. 8, therein is shown a cross-sectional view, taken along line 8-8 in FIG. 4. Fabrication of the passive components 404 and the active components 406 on a first side 802 of the substrate 402 can reduce the quality of the overall circuit. For example, processes such as ion implantation alter the surface mobility of all such processed areas of the first side 802 of the substrate 402, including the passive components 404.

It has been discovered that maintaining a high resistance of the substrate, for example greater than 4000 ohms, ensures electrical isolation and reduces substrate leakage. Thus, in one embodiment, in order to maintain a resistance of greater than 4000 ohms, only the passive components 404 are fabricated on the first side 802 of the substrate 402. On the other hand, fabrication of the active components 406 is completed prior to integration onto the substrate 402. It has been discovered that in order to maintain device performance, the active components 406 are integrated onto the substrate 402 a first distance 808, such as at least 500 μm for the current generation of products, from the passive components 404.

In order to further enhance performance, it has been discovered that the passive components 404 need to be fabricated to be free of (i.e. are not affected by) a ground plane. The primary way that substrate thickness affects inductor characteristics is that the ground plane beneath the inductor effectively creates an image inductor mirrored beneath the ground plane. The image inductor has a negative mutual coupling to the actual inductor. The net effect is to lower the overall inductance of the device. The closer the ground plane is to the inductor, the more severe the effect. These effects are relative—i.e. the distance to the ground plane relative to the physical size of the inductor determines the extent to which the ground-plane effect is important.

It has been discovered that the passive components 404 are not affected by a reference ground plane 804 spaced a second distance 810 from the passive components 404. The second distance 810 is calculated by solving for the distance equation:

$$_{real}Y_{11} = \frac{Q}{L 2\pi f}$$

Where Y is the distance to the ground plane, Q is the quality, L is the inductance, and f is the frequency.

The solder bumps 502 electrically connect the active components 406 to the substrate 402. The wires 408 electrically connect the solder bumps 502. It has been discovered that the passive components 404 are not affected by the wires 408 spaced a third distance 812 at least 500 μm from the passive components 404. Therefore, the wires 408 are located at least 500 μm from the passive components 404.

The first side printed wires 410 electrically connect the solder bumps 502 to the passive components 404 and the vias 504. The vias 504 extend through the substrate 402, electrically connecting the first side 802 to a second side 806. Thus, the vias 504 electrically connect the first side printed wires 410 to the second side printed wires 704 and the solder balls 702.

Figure 9:
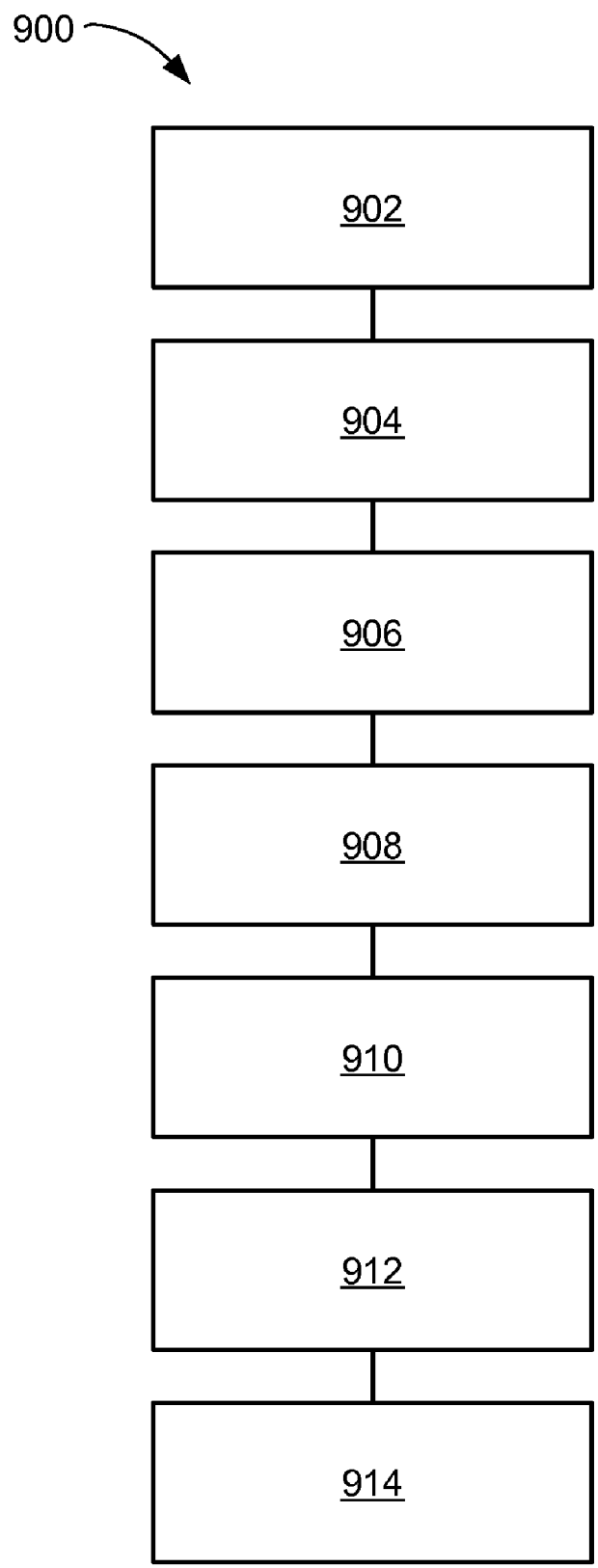
FIG. 9 is a flow chart of a method for manufacturing a chip carrier in accordance with the present invention.

Referring now to FIG. 9, therein is shown a flow chart of a method 900 for fabrication of a chip carrier in accordance with the present invention. The method 900 includes providing a substrate having a ground plane, a first side, and a second side in a block 902; forming a via that electrically connects the first side to the second side in a block 904; forming a printed wire on the first side in a block 906; forming a printed wire on the second side in a block 908; forming a passive component on the first side in a block 910; forming the passive component free of a passive component ground plane in a block 912; and attaching an active component to the first side in a block 914.

Thus, it has been discovered that the chip carrier method and apparatus of the present invention furnish important and heretofore unavailable solutions, capabilities, and functional advantages among the elements on a chip carrier. The resulting processes and configurations are straightforward, economical, uncomplicated, highly versatile and effective, use conventional technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for manufacturing a chip carrier, comprising:
   providing a substrate having a ground plane, a first side, and a second side;
   forming a via that electrically connects the first side to the second side;
   forming a printed wire on the first side;
   forming a printed wire on the second side;
   forming a passive component on the first side, the passive component free of the ground plane; and
   attaching an active component to the first side, the active component spaced a first distance from the passive component,
   forming a solder ball on the second side; and
   forming the solder ball in a region on the second side outside a region located under the passive component.

2. The method of claim 1 wherein forming the passive component on the first side, the passive component free of the ground plane, includes forming the passive component spaced at least a second distance from the around plane.

3. The method of claim 1 wherein forming the via that electrically connects the first side to the second side further comprises forming the via by reactive ion etching, wet etching, laser drilling, EDO drilling, or drilling with a ceramic bit.

4. The method of claim 1 further comprising electrically connecting the passive component to the active component and via with the printed wire on the first side.

5. A method for manufacturing a chip carrier, comprising:
   providing a substrate having a ground plane, a first side, and a second side;
   forming vias that electrically connect the first side to the second side, the vias being coaxial structures;
   forming printed wires on the first side;
   forming printed wires on the second side;
   forming passive components on the first side, the passive components free of the ground plane; and
   attaching fabricated active components to the first side with solder bumps, the fabricated active components spaced a first distance from the passive components,
   electrically connecting the passive components to the active components and vias with the printed wires on the first side; and electrically connecting the solder bumps with wires spaced at least 500 µm from the passive components.

6. The method of claim 5 wherein forming vias that electrically connect the first side to the second side further comprises forming vias by reactive ion etching, wet etching, laser drilling, EDO drilling, or drilling with a ceramic bit.

7. The method of claim 5 further comprising:
forming solder balls on the second side; and
forming the solder balls in a region on the second side outside the regions under the passive components.

8. A chip carrier, comprising:
a substrate having a ground plane, a first side, and a second side;
a via that electrically connects the first side to the second side;
a printed wire on the first side;
a printed wire on the second side;
a passive component, free of the ground plane, formed on the first side; and
an active component attached to the first side, the active component spaced a first distance from the passive component, and
further comprising a solder ball formed on the second side, wherein the solder ball is formed in a region on the second side located outside a region under the passive component.

9. The chip carrier of claim 8 wherein the passive component, free of the ground plane, includes the passive component spaced at least a second distance from the ground plane.

10. The chip carrier of claim 8 wherein the via is a circuit element in a passive network.

11. The chip carrier of claim 8 wherein the passive component is electrically connected to the active component and via with the printed wire on the first side.

12. A chip carrier, comprising:
a substrate having a ground plane, a first side, and a second side;
vias that:
electrically connect the first side to the second side, and
are coaxial structures to reduce interference;
printed wires on the first side;
printed wires on the second side;
passive components, spaced at least a second distance from the ground plane, formed on the first side;
fabricated active components, the fabricated active components spaced a first distance from the passive components; and
solder bumps attaching the fabricated active components to the first sides,
wherein the printed wires on the first side electrically connect the passive components, the active components, and the vias, and
further comprising wires, spaced at least 500 µm from the passive components, electrically connecting the solder bumps.

13. The chip carrier of claim 12 wherein the vias are of different diameters and are circuit elements in a passive network.

14. The chip carrier of claim 12 further comprising solder balls formed on the second side, and wherein the solder balls are formed in a region on the second side outside the regions under the passive components.

* * * * *

UNITED STATES PATENT AND TRADEMARK OFFICE
CERTIFICATE OF CORRECTION

| | | |
|---|---|---|
| PATENT NO. | : 7,733,661 B2 | Page 1 of 1 |
| APPLICATION NO. | : 12/393034 | |
| DATED | : June 8, 2010 | |
| INVENTOR(S) | : Kossives et al. | |

It is certified that error appears in the above-identified patent and that said Letters Patent is hereby corrected as shown below:

In the Specification:

Column 5:
    Line 50, delete "f" and insert therefore --*f*--

In the Claims:

Column 6:
    Claim 2, line 46, delete "around" and insert therefor --ground--

Column 8:
    Claim 12, line 18, delete "sides," and insert therefor --side,--

Signed and Sealed this

Twenty-fourth Day of August, 2010

David J. Kappos
*Director of the United States Patent and Trademark Office*